US 8,362,774 B2

(12) United States Patent
Katsunuma et al.

(10) Patent No.: US 8,362,774 B2
(45) Date of Patent: Jan. 29, 2013

(54) COOLING MRI COMPONENTS/ELECTRONIC CIRCUIT ELEMENTS/BED THROUGH GAS FLOW PATHS FORMED BETWEEN CYLINDRICAL RF COIL UNIT BASE AND CYLINDRICAL BORE TUBE

(75) Inventors: Ayumi Katsunuma, Otawara (JP);
Kazuhiko Tsujita, Otawara (JP);
Hiromitsu Takamori, Otawara (JP)

(73) Assignees: Kabushiki Kaisha Toshiba, Minato-ku, Tokyo (JP); Toshiba Medical Systems Corporation, Otawara-shi, Tochigi (JP)

( * ) Notice: Subject to any disclaimer, the term of this patent is extended or adjusted under 35 U.S.C. 154(b) by 0 days.

(21) Appl. No.: 12/273,013

(22) Filed: Nov. 18, 2008

(65) Prior Publication Data
US 2009/0134874 A1   May 28, 2009

(30) Foreign Application Priority Data
Nov. 22, 2007   (JP) ................................. 2007-303246

(51) Int. Cl.
*G01V 3/00* (2006.01)
(52) U.S. Cl. .......................... 324/318; 324/322; 324/309
(58) Field of Classification Search .......... 324/300–322; 600/40, 411; 382/128–131
See application file for complete search history.

(56) References Cited

U.S. PATENT DOCUMENTS

| | | | |
|---|---|---|---|
| 5,489,848 A * | 2/1996 | Furukawa ...................... | 324/318 |
| 6,496,006 B1 * | 12/2002 | Vrijheid ........................ | 324/318 |
| 6,768,306 B2 | 7/2004 | Morita et al. .................. | 324/322 |
| 6,774,631 B2 * | 8/2004 | Heid .............................. | 324/318 |
| 6,867,592 B2 * | 3/2005 | Gebhardt et al. ............. | 324/318 |
| 6,894,495 B2 * | 5/2005 | Kan ................................ | 324/318 |
| 6,909,283 B2 * | 6/2005 | Emeric et al. ................. | 324/300 |
| 6,967,482 B2 | 11/2005 | Morita et al. .................. | 324/322 |
| 6,975,118 B2 | 12/2005 | Okada et al. ................... | 324/321 |
| 6,992,483 B1 * | 1/2006 | Emeric et al. ................. | 324/300 |
| 6,998,842 B2 * | 2/2006 | Sinnema et al. .............. | 324/318 |

(Continued)

FOREIGN PATENT DOCUMENTS

| | | |
|---|---|---|
| JP | 08-322815 | 12/1996 |
| JP | 09-000510 | 1/1997 |

(Continued)

OTHER PUBLICATIONS

Chinese Search Report dated Aug. 10, 2010, re Japanese Patent Application No. H7-157482.

*Primary Examiner* — Melissa Koval
*Assistant Examiner* — Tiffany Fetzner
(74) *Attorney, Agent, or Firm* — Nixon & Vanderhye PC

(57) ABSTRACT

A magnetic resonance apparatus includes a static field magnet, a gradient field coil, a cover which forms, inside the static field magnet and the gradient field coil, an internal space in which a bed top and a subject placed on the bed top are to be inserted, a radio frequency coil unit which includes a cylindrical base portion and first electronic elements and second electronic elements and is placed in the internal space, a first flow path which is formed between the base portion and the cover to cool the first electronic elements, a second flow path which is formed between the base portion and the cover and communicates with the first flow path to cool the second electronic elements, and a cooling unit which cools the radio frequency coil unit by generating a cooling gas flow flowing from the first flow path to the second flow path.

15 Claims, 14 Drawing Sheets

U.S. PATENT DOCUMENTS

| | | | |
|---|---|---|---|
| 7,015,692 B2* | 3/2006 | Clarke et al. | 324/318 |
| 7,084,635 B2 | 8/2006 | Morita et al. | 324/322 |
| 7,141,979 B2 | 11/2006 | Marek | 324/322 |
| 7,154,270 B2* | 12/2006 | Arz et al. | 324/318 |
| 7,161,353 B2* | 1/2007 | Schaaf et al. | 324/318 |
| 7,301,343 B1* | 11/2007 | Sellers | 324/318 |
| 7,368,913 B2* | 5/2008 | Sellers et al. | 324/318 |
| 7,570,058 B1* | 8/2009 | Wong et al. | 324/318 |
| 7,576,542 B1* | 8/2009 | Lvovsky | 324/318 |
| 7,663,366 B2* | 2/2010 | Takamori | 324/318 |
| 7,701,216 B2* | 4/2010 | Du et al. | 324/318 |
| 7,759,935 B2 | 7/2010 | DeVries et al. | 324/318 |
| 7,868,617 B2* | 1/2011 | Seeber et al. | 324/318 |
| 2001/0033168 A1* | 10/2001 | Heid | 324/318 |
| 2003/0206018 A1* | 11/2003 | Gebhardt et al. | 324/318 |
| 2004/0119472 A1* | 6/2004 | Laskaris et al. | 324/318 |
| 2005/0030028 A1* | 2/2005 | Clarke et al. | 324/318 |
| 2005/0035764 A1* | 2/2005 | Mantone et al. | 324/318 |
| 2005/0168222 A1* | 8/2005 | Arz et al. | 324/318 |
| 2005/0179512 A1* | 8/2005 | Weyers et al. | 335/300 |
| 2006/0038567 A1* | 2/2006 | Morita et al. | 324/318 |
| 2006/0082370 A1* | 4/2006 | Cirel | 324/318 |
| 2007/0016003 A1* | 1/2007 | Piron et al. | 600/415 |
| 2008/0001601 A1* | 1/2008 | Sellers et al. | 324/318 |
| 2008/0173026 A1* | 7/2008 | Mita et al. | 62/6 |
| 2009/0128269 A1* | 5/2009 | Seeber et al. | 324/318 |
| 2009/0134874 A1* | 5/2009 | Katsunuma et al. | 324/318 |
| 2009/0174407 A1* | 7/2009 | Han et al. | 324/318 |
| 2010/0134109 A1* | 6/2010 | Takamori | 324/318 |
| 2010/0219347 A1* | 9/2010 | Schulz et al. | 324/318 |
| 2011/0254551 A1* | 10/2011 | Leussler | 324/318 |

FOREIGN PATENT DOCUMENTS

| | | |
|---|---|---|
| JP | H7-157482 | 1/1999 |
| JP | 11-244255 | 9/1999 |
| JP | 2004-33380 | 2/2004 |

* cited by examiner

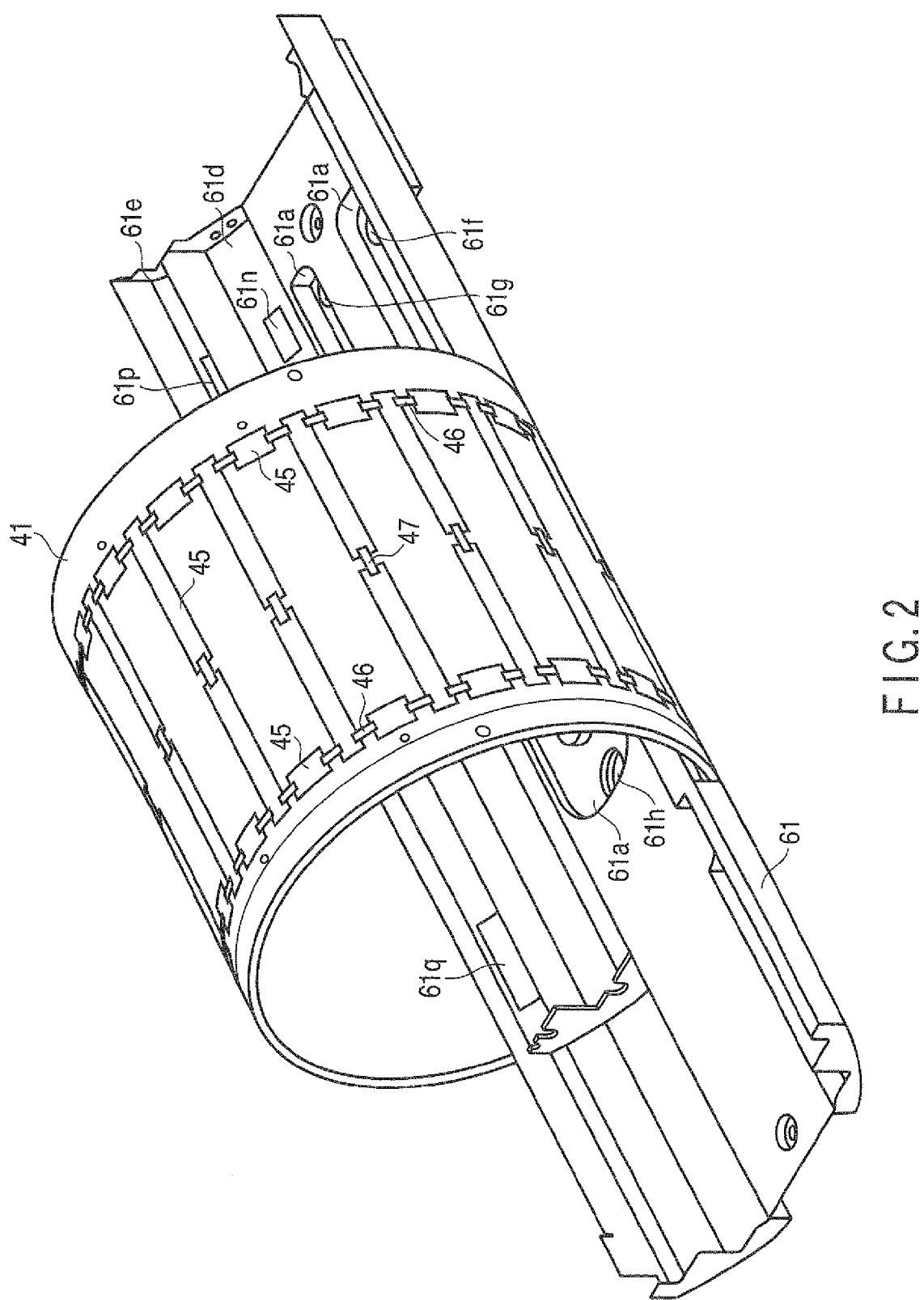
F I G. 2

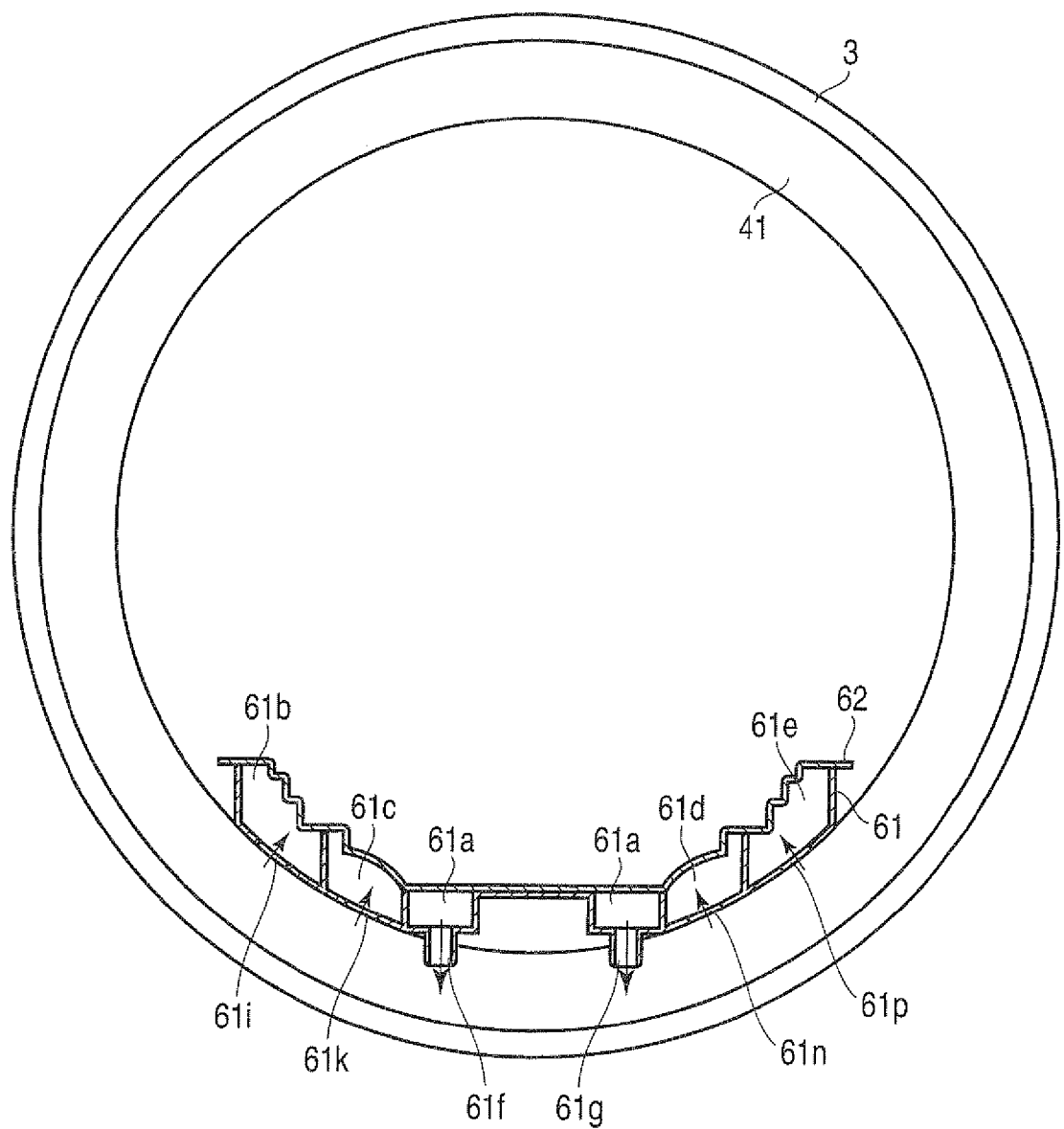
F I G. 6

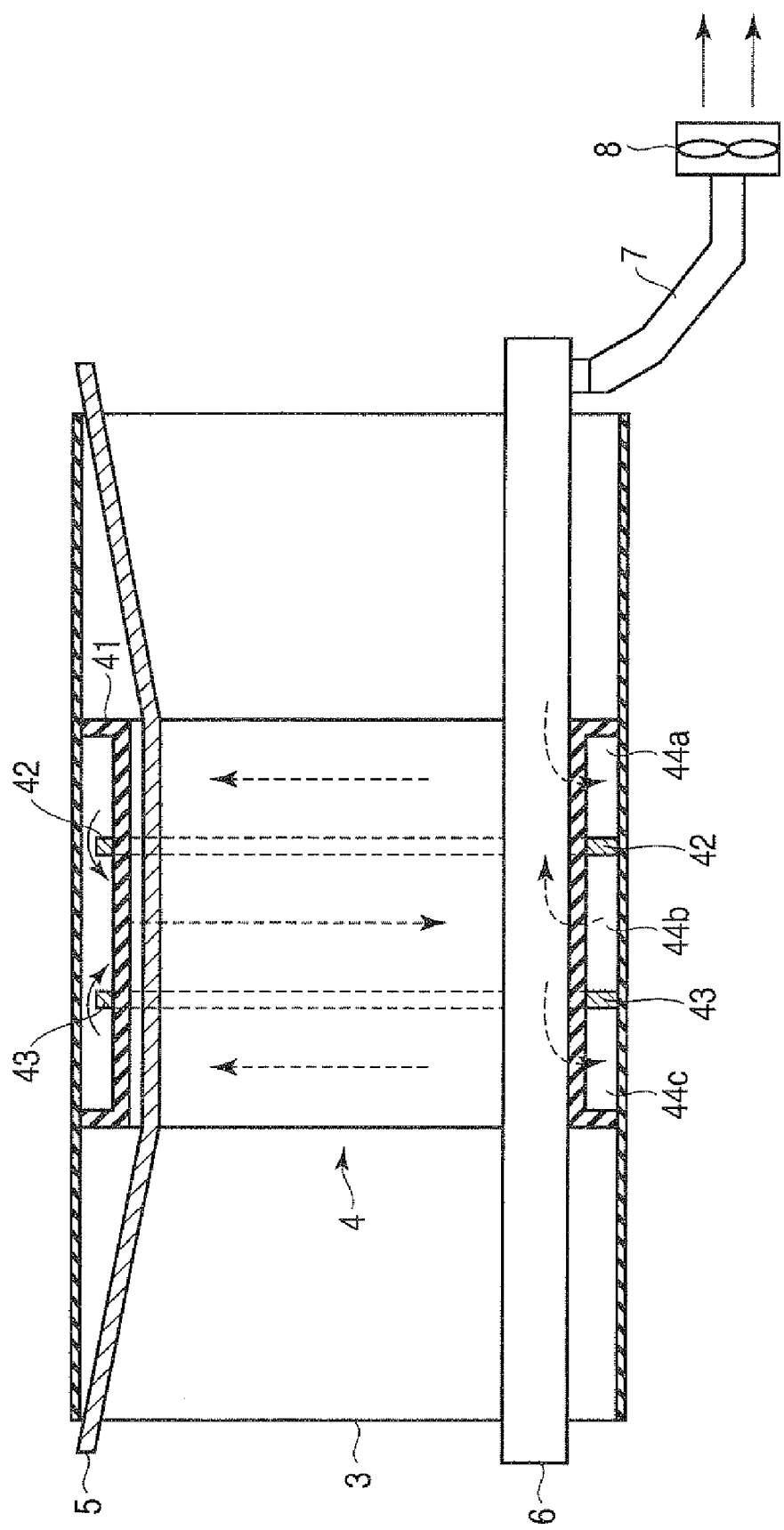
F I G. 10

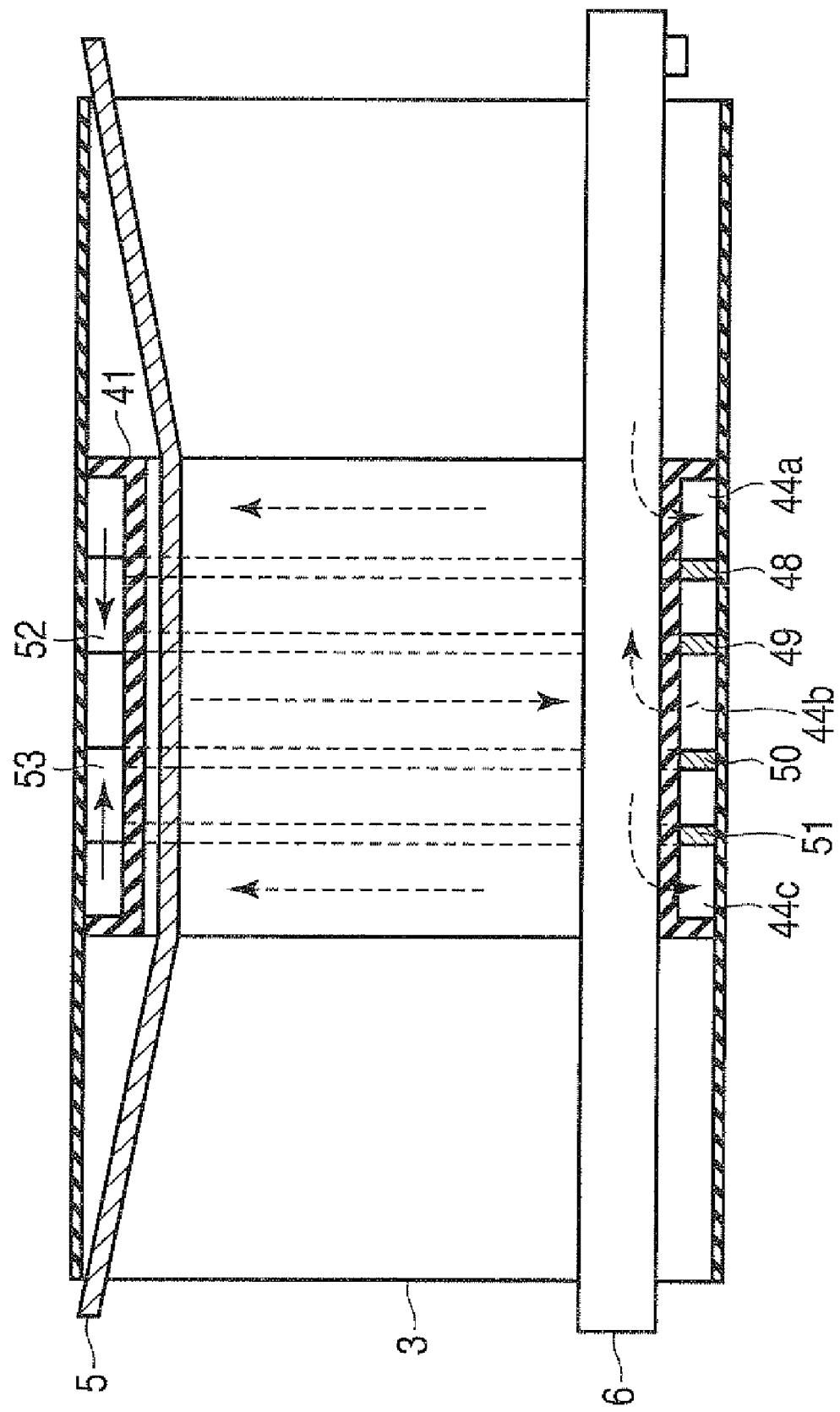
F I G. 11

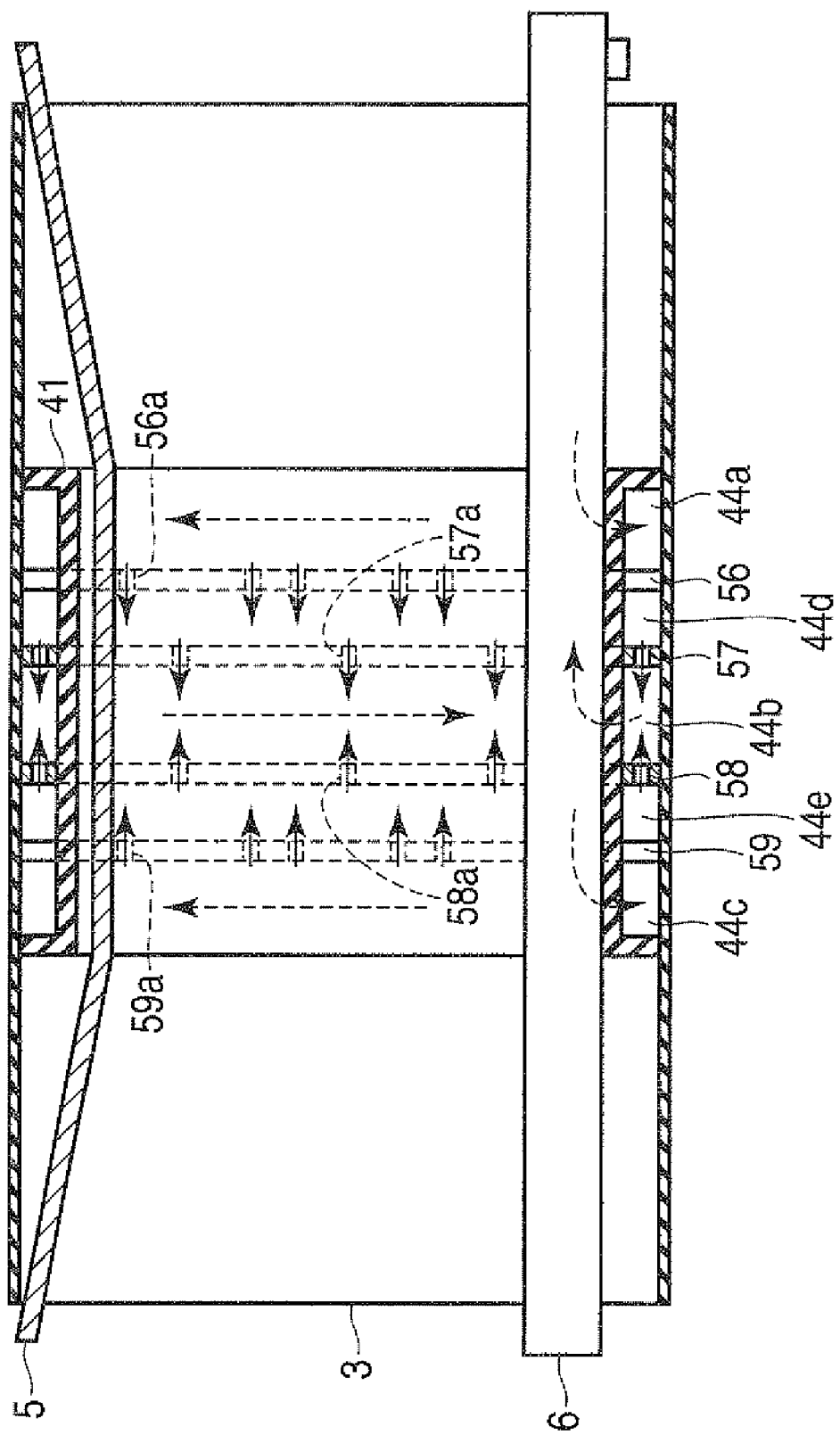
F I G. 13

COOLING MRI COMPONENTS/ELECTRONIC CIRCUIT ELEMENTS/BED THROUGH GAS FLOW PATHS FORMED BETWEEN CYLINDRICAL RF COIL UNIT BASE AND CYLINDRICAL BORE TUBE

CROSS-REFERENCE TO RELATED APPLICATIONS

This application is based upon and claims the benefit of priority from prior Japanese Patent Application No. 2007-303246, filed Nov. 22, 2007, the entire contents of which are incorporated herein by reference. This application is related to copending commonly owned application Ser. No. 12/273,787 filed Nov. 19, 2008, naming Tohima, Ishihara, Mitsui, Takamori and Katsunuma as co-inventors.

BACKGROUND OF THE INVENTION

1. Field of the Invention

The present invention relates to a magnetic resonance apparatus having a radio frequency (RF) coil placed inside a gantry.

2. Description of the Related Art

A magnetic resonance apparatus generally has an RE coil such as a whole body (WB) coil placed inside a gantry.

An RF coil generates heat upon being energized. Conventionally, the cooling of the RF coil relies on natural convection around the coil, and no special cooling means is used.

Note that a structure for cooling an RE coil by using cooling water is known in, for example, Jpn. Pat. Appln. KOKAI Publication No. 11-244255.

The heat generated by an RF coil therefore raises the temperature in the imaging space in a gantry and may give an uncomfortable feeling to a subject to be examined who is placed in the imaging space.

An attempt has therefore been made to make it difficult to transmit the heat generated by an RF coil to an imaging space by placing a cover on the RF coil at a certain interval. In this case, however, the cover reduces the imaging space. This may give an oppressive feeling to the subject.

The structure known in Jpn. Pat. Appln. KOKAI Publication No. 11-244255 includes a cooling portion with a bulky structure, which requires a large accommodation space. This may reduce the imaging space and gives an oppressive feeling to a subject.

BRIEF SUMMARY OF THE INVENTION

Under the circumstances, it has been required to prevent the heat generated by an RF coil placed inside a gantry from raising the temperature in an imaging space.

According to a first aspect of the present invention, there is provided a magnetic resonance apparatus comprising: a static field magnet which generates a static magnetic field; a gradient field coil which generates a gradient magnetic field to be superimposed on the static magnetic field; a cover which forms, inside the static field magnet and the gradient field coil, an internal space in which a bed top and a subject placed on the bed top are to be inserted; a radio frequency coil unit which includes a cylindrical base portion and a plurality of first electronic elements and a plurality of second electronic elements arranged on the base portion and is placed in the internal space; a first flow path which is formed between the base portion and the cover to cool the first electronic elements; a second flow path which is formed between the base portion and the cover and communicates with the first flow path to cool the second electronic elements; and a cooling unit which cools the radio frequency coil unit by generating a cooling gas Flow flowing from the first flow path to the second flow path.

According to a second aspect of the present invention, there is provided a magnetic resonance apparatus comprising: a static field magnet which generates a static magnetic field; a gradient field cools which generates a gradient magnetic field to be superimposed on the static magnetic field; a cover which forms inside the static field magnet and the gradient field coil, an internal space in which a bed top and a subject placed on the bed top are to be inserted; a radio frequency coil unit which includes a cylindrical base portion and a plurality of electronic elements arranged on the base portion and is placed in the internal space; a flow path which is formed between the base portion and the cover circumferentially relative to the base portion to cool the electronic elements; and a cooling unit which cools the radio frequency coil unit by generating two types of flows in different directions circumferentially relative to the base portion as cooling gas Flows in the flow path.

According to a third aspect of the present invention, there is provided a magnetic resonance apparatus comprising: a static field magnet which generates a static magnetic field; a gradient field coil which generates a gradient magnetic field to be superimposed on the static magnetic field; a cover which forms, inside the static field magnet and the gradient field coil, an internal space in which a bed top and a subject placed on the bed top are to be inserted; a radio frequency coil unit which includes a cylindrical base portion and a plurality of electronic elements arranged on the base portion in a circumferential direction thereof and is placed in an internal space; a flow path which guides a cooling gas in the circumferential direction of the base portion; at least one discharge port which discharges the cooling gas from the flow path toward the electronic elements; and a cooling unit which cools the radio frequency coil unit by generating a flow of the cooling gas discharge from the discharge port toward the electronic elements through the flow path.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a perspective view showing the structures of part of a body coil unit and part of a bed rail in FIG. 1;

FIG. 6 is a sectional view taken along a one-dot dashed line A of FIG. 1 when viewed from the left side of FIG. 1;

FIG. 10 is a view showing the flow of air when a fan in FIG. 1 is actuated;

FIG. 11 is a view showing a first modified arrangement;

FIG. 13 is a view showing a third modified arrangement;

DETAILED DESCRIPTION OF THE INVENTION

An embodiment of the present invention will be described below with reference to the views of the accompanying drawing.

Figure 1:
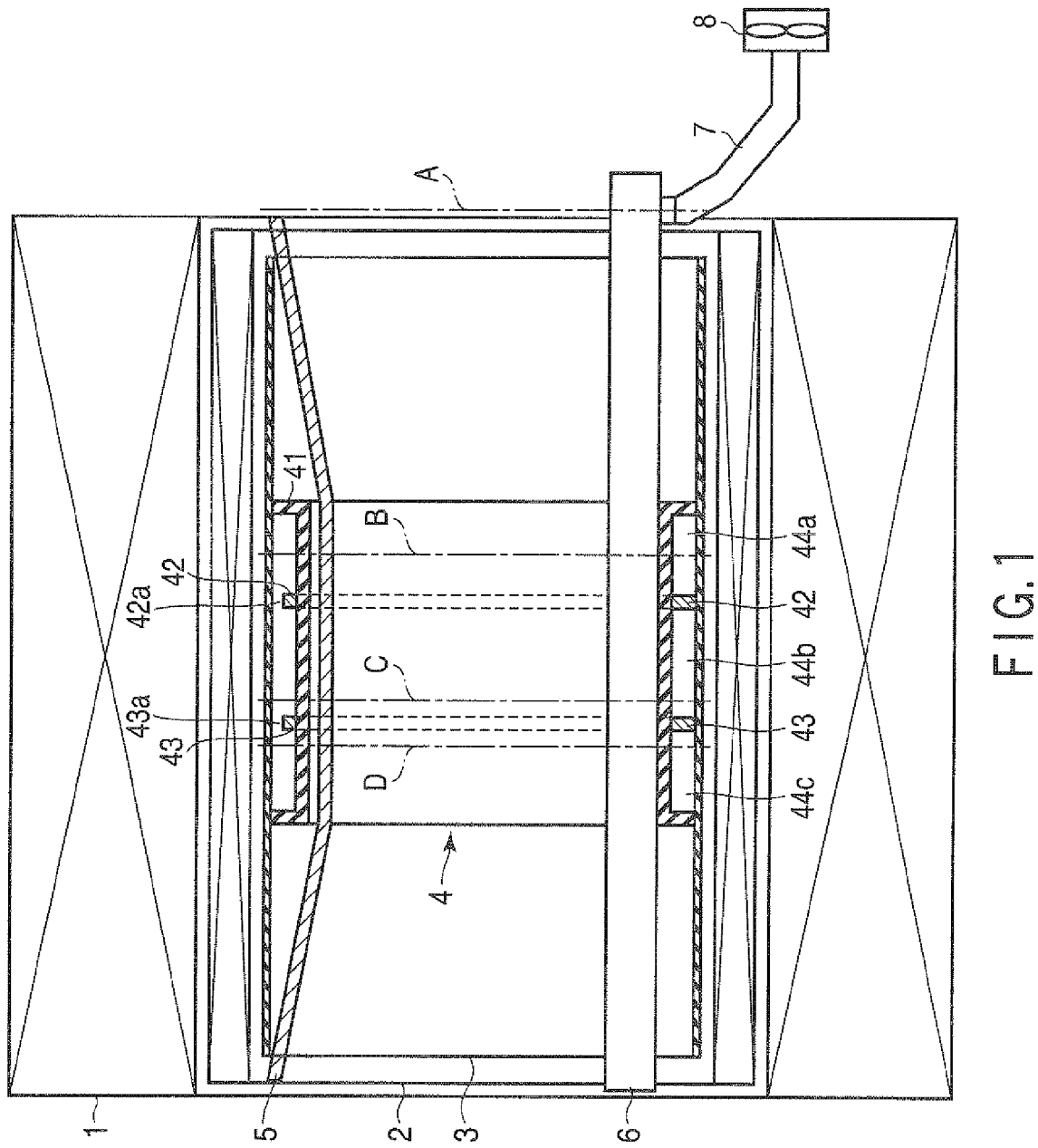
FIG. 1 is a partially cutaway view of the structure of the gantry of a magnetic resonance apparatus according to an embodiment of the present invention.

FIG. 1 is a partially cutaway view of the structure of the gantry of a magnetic resonance apparatus according to this embodiment.

The gantry of the magnetic resonance apparatus accommodates a static field magnet 1, a gradient field coil unit 2, a bore tube 3, a body coil unit 4, a cover 5, and a bed rail 6.

The static field magnet 1 has a hollow cylindrical shape, and generates a uniform static magnetic field in the internal space. As the static field magnet 1, for example, a permanent magnet or a superconductive magnet is used.

The gradient field coil unit 2 has a hollow cylindrical shape. The gradient field coil unit 2 is placed inside the static field magnet 1 while they are almost axially aligned with each other. The gradient field coil unit 2 includes a combination of three types of coils corresponding to X-, Y-, and Z-axes perpendicular to each other. The gradient field coil unit 2 generates gradient magnetic fields whose magnetic field strengths incline along the X-, Y-, and Z-axes, respectively, when the above three types of coils separately receive currents from gradient field power supplies. Note that the axis direction coincides with, for example, the static magnetic field direction. Gradient magnetic fields along the X-, Y-, and Z-axes respectively correspond to a slice selection gradient magnetic field Gs, a phase encoding gradient magnetic field Ge, and a readout gradient magnetic field Gr. The slice selection gradient magnetic field Gs is used to arbitrarily determine an imaging slice. The phase encoding gradient magnetic field Ge is used to encode the phase of a magnetic resonance signal in accordance with a spatial position. The readout gradient magnetic field Gr is used to encode the frequency of a magnetic resonance signal in accordance with a spatial position. As the gradient field coil unit 2, a so-called actively shielded gradient coil (ASGC) can be used.

The bore tube 3 has a hollow cylindrical shape. The bore tube is placed inside the gradient field coil unit 2 while being axially aligned with the gradient field coil unit. The inside of bore tube 3 forms an imaging space in which a subject to be examined is placed to be imaged.

The body coil unit 4 has a hollow cylindrical shape, and includes a base portion 41 having flanges extending outward from the two ends and partition members 42 and 43. The base portion 41 is placed inside the bore tube 3 with the distal ends of the flanges being attached to the inner surface of the bore tube 3. A whole body (WB) RF coil is mounted on the outer surface of the base portion 41. The WB RF coil is, for example, a birdcage coil. A toroidal shape space is formed between the base portion 41 and the bore tube 3. The WB RF coil is placed inside the space. Note that the WB RF coil is not illustrated in FIG. 1. The partition members 42 and 43 are made of, for example, urethane foam, and have almost toroidal shapes. The partition members 42 and 43 have inner diameters almost equal to the outer diameter of the base portion 41 and widths almost equal to the protrusion amount of each flange of the base portion 41. The partition members 42 and 43 are placed outside the base portion 41. The partition members 42 and 43 therefore partition the space between the base portion 41 and the bore tube 3 into three spaces 44a, 44b, and 44c. A notch is formed in one outer portion of each of the partition members 42 and 43 to form openings 42a and 43a which make the spaces 44a and 44b communicate each other and the spaces 44b and 44c communicate with each other. Note that air is made to flow in the spaces 44a, 44b, and 44c, as will be described later, and the spaces 44a, 44b, and 44c function as ducts.

The cover 5 covers the body coil unit 4 to prevent the subject placed in the imaging space from touching the body coil unit 4.

The bed rail 6 is placed so as to extend through the inside of the body coil unit 4. The bed rail 6 guides a bed top (not shown), which is conveyed laterally from the right side of FIG. 1. A plurality of ducts (to be described later) are formed inside the bed rail 6. These ducts are made to communicate with either of the spaces 44a, 44b, and 44c. A fan 8 is connected to one of the ducts in the bed rail 6 through an extension duct 7.

Figure 3:
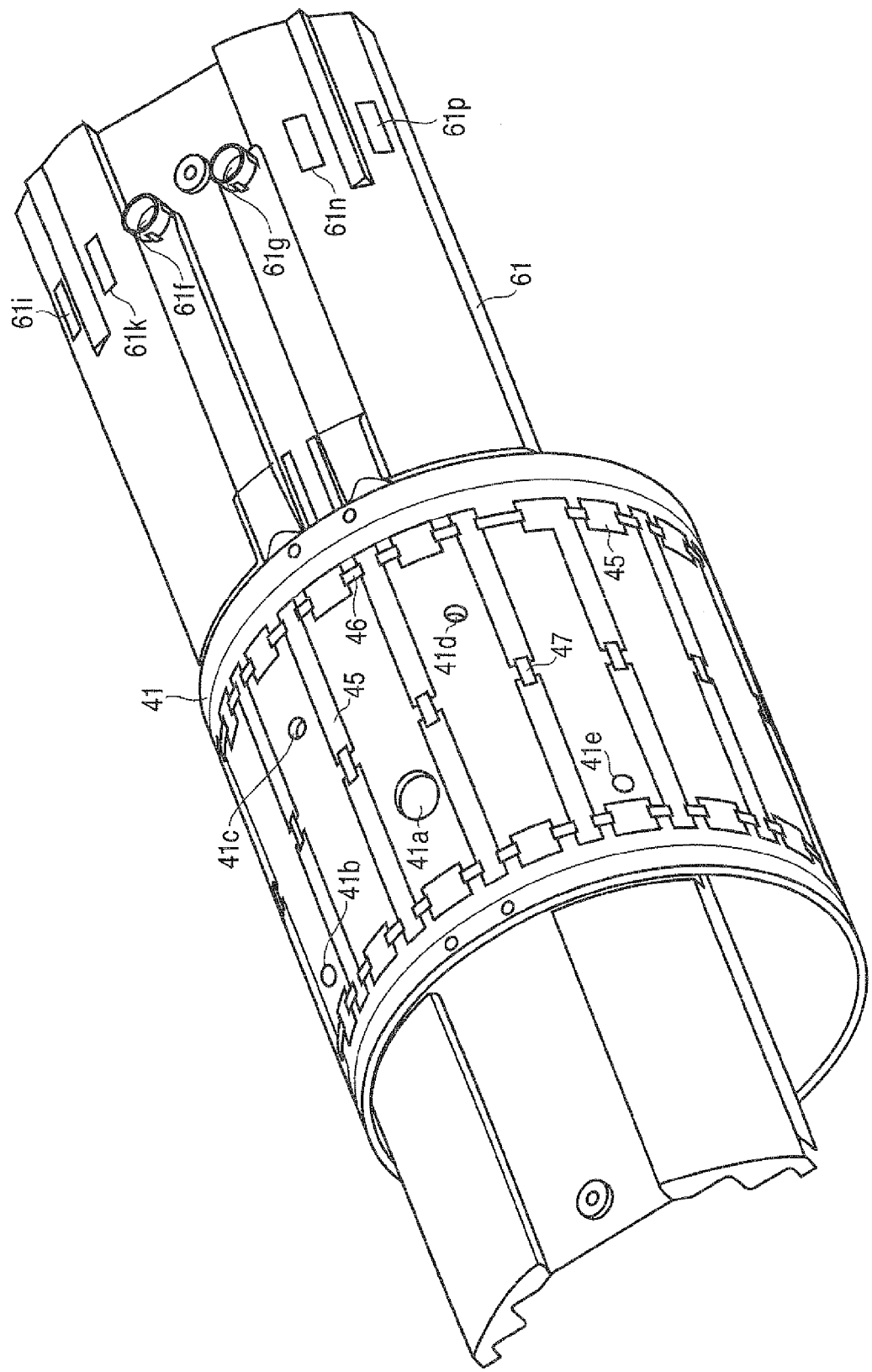
FIG. 3 is a perspective view showing the structures of part of the body coil unit and part of the bed rail in FIG. 1.
Figure 4:
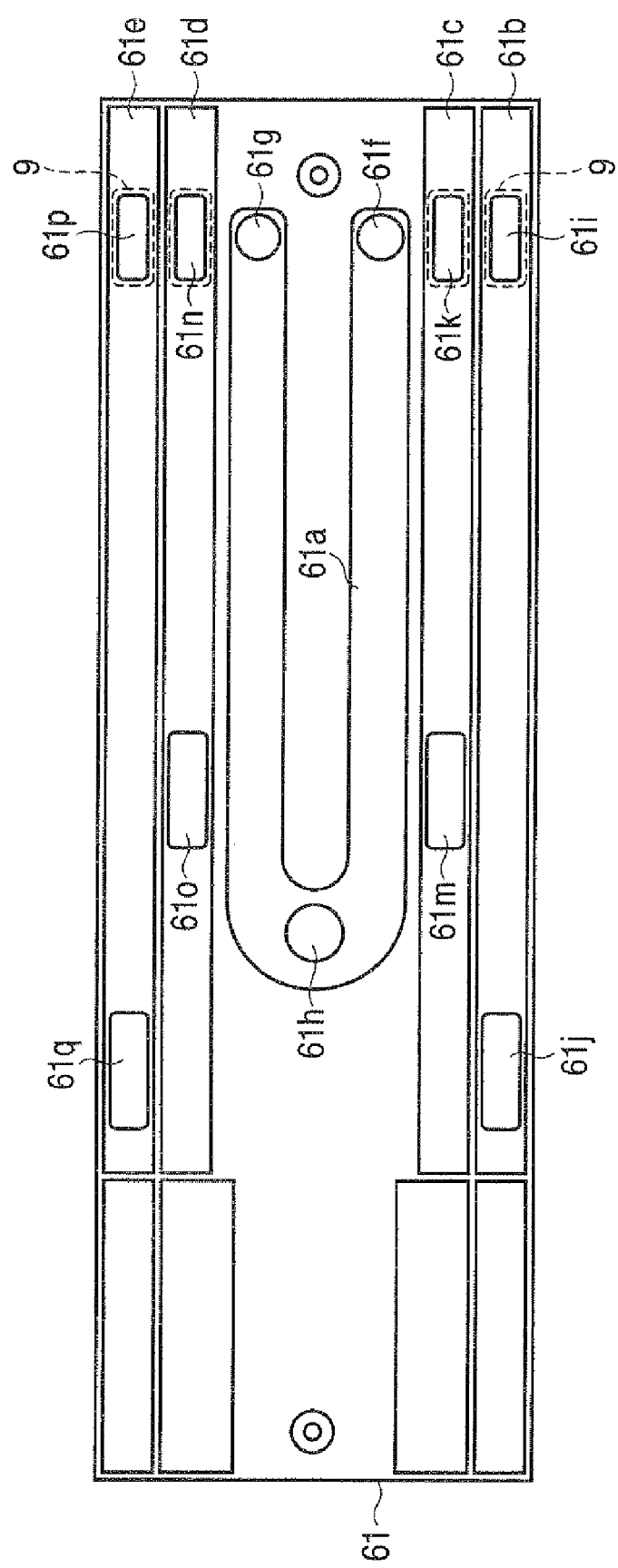
FIG. 4 is a plan view of a lower member in FIGS. 2 and 3.

FIGS. 2 and 3 are perspective views showing the structures of part of the body coil unit 4 and part of the bed rail 6. FIG. 2 is a view seen obliquely downward from the upper left side of FIG. 1. FIG. 3 is a view seen obliquely upward from the lower left side of FIG. 1. The flanges of the base portion 41 and the partition members 42 and 43 of the body coil unit 4 are not illustrated in FIGS. 2 and 3. Only a lower member 61 of the bed rail 6 is illustrated in FIGS. 2 and 3. FIG. 4 is a plan view of the lower member 61.

The outer surface of the base portion 41 is provided with many conductive patterns 45 and many circuit elements 46 and 47 which form the body coil. The circuit elements 46 are, for example, capacitors. The circuit elements 47 are, for example, pin diodes. The many circuit elements 46 are arranged near the two side ends of the base portion 41 circumferentially relative to the base portion 41. The many circuit elements 47 are arranged near the middle of the base portion circumferentially relative to the base portion 41.

One U-shaped groove 61a and four linear grooves 61b, 61c, 61d, and 61e are formed in the lower member 61 longitudinally. Each of the grooves 61a to 61e is open upward. The lower member 61 also has openings 61f, 61g, 61h, 61i, 61j, 61k, 61m, 61n, 61o, 61p, and 61q formed in the bottom surfaces of the grooves 61a to 61e at positions near the two ends of the groove 61a, in the curved portion of the groove 61a, and near the two ends of each of the grooves 61b to 61e.

The base portion 41 has an opening 41a at a position facing the opening 61h, an opening 41b at a position facing the opening 61t, an opening 41c at a position facing the opening 61m, an opening 41d at a position facing the opening 61o, and an opening 41e at a position facing opening 61q in the state shown in FIG. 3. Note that the opening 41a is located near the array of the circuit elements 47, the openings 41b and 41e are located near one array of the circuit elements 46, and the openings 41c and 41d are located near the other array of the circuit elements 46.

Figure 5:
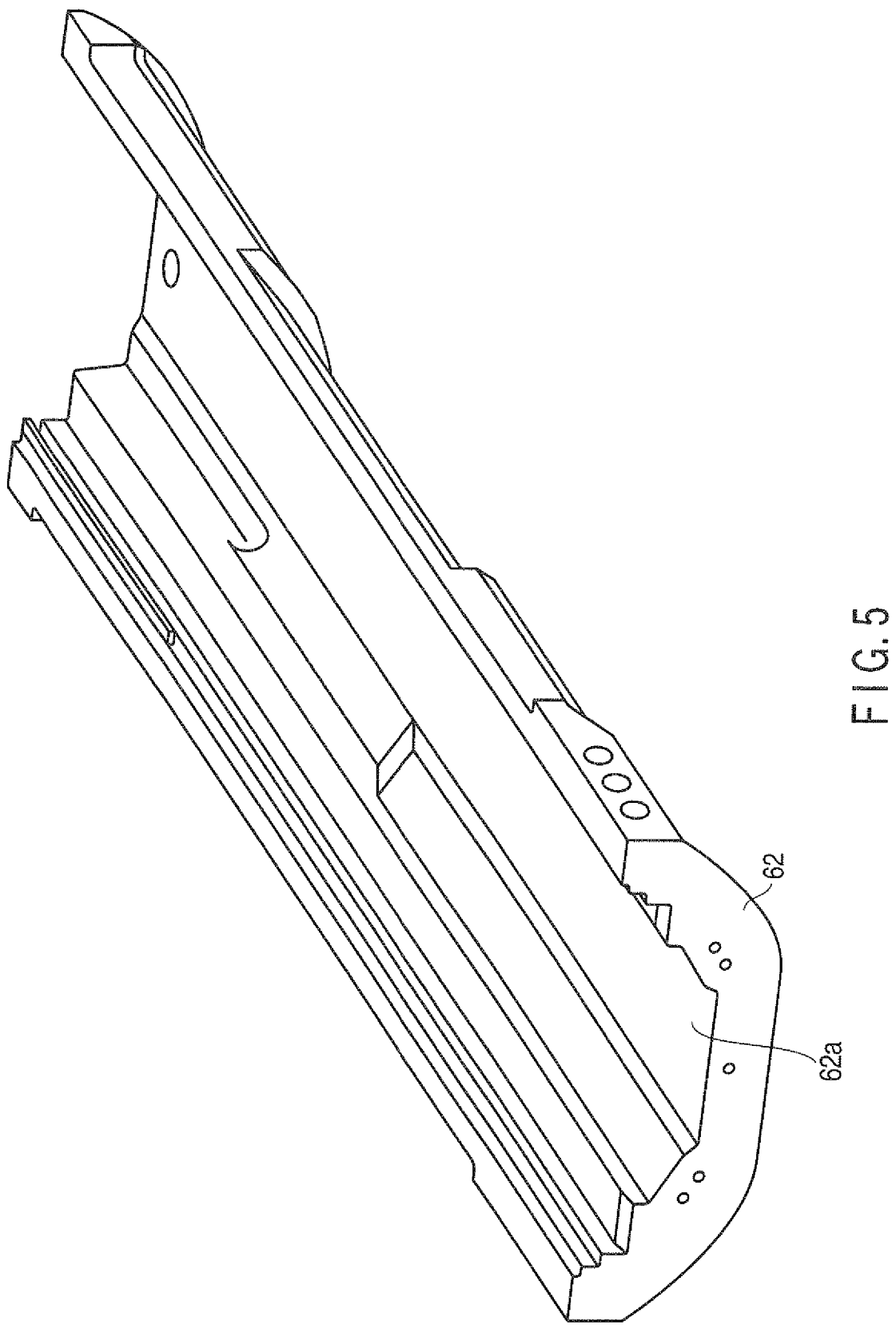
FIG. 5 is a perspective view showing the structure of the upper member of the bed rail in FIG. 1.

FIG. 5 is a perspective view showing the structure of an upper member 62 of the bed rail 6.

The upper member 62 has a recess portion 62a formed on the upper side longitudinally. The recess portion 62a guides the movement of the bed top longitudinally relative to the upper member 62. The lower side of the upper member 62 has a shape to fit in the upper side of the lower member 61. When the upper member 62 is mounted on the upper portion of the lower member 61, the bed rail 6 is formed. The bed rail 6 closes the upper sides of the grooves 61a, 61h, 61c, 61d, and 61e. Six ducts like those shown in FIGS. 6 to 9 are formed inside the bed rail 6. These six ducts will be sequentially referred to as the first to sixth ducts from the left side in FIG. 6.

FIGS. 6 to 9 are sectional views taken along one-dot dashed lines A to D of FIG. 1 when viewed from the left side of FIG. 1.

As shown in FIG. 6, the first to sixth ducts are open to the outside of the gantry through the openings 61i, 61k, 61f, 61g, 61n, and 61p. Filters 9 (e.g., see FIG. 4) are respectively attached to the openings 61i, 61k, 61n, and 61p. The extension duct 7 is attached to the openings 61f and 61g, as shown in FIG. 1.

Figure 7:
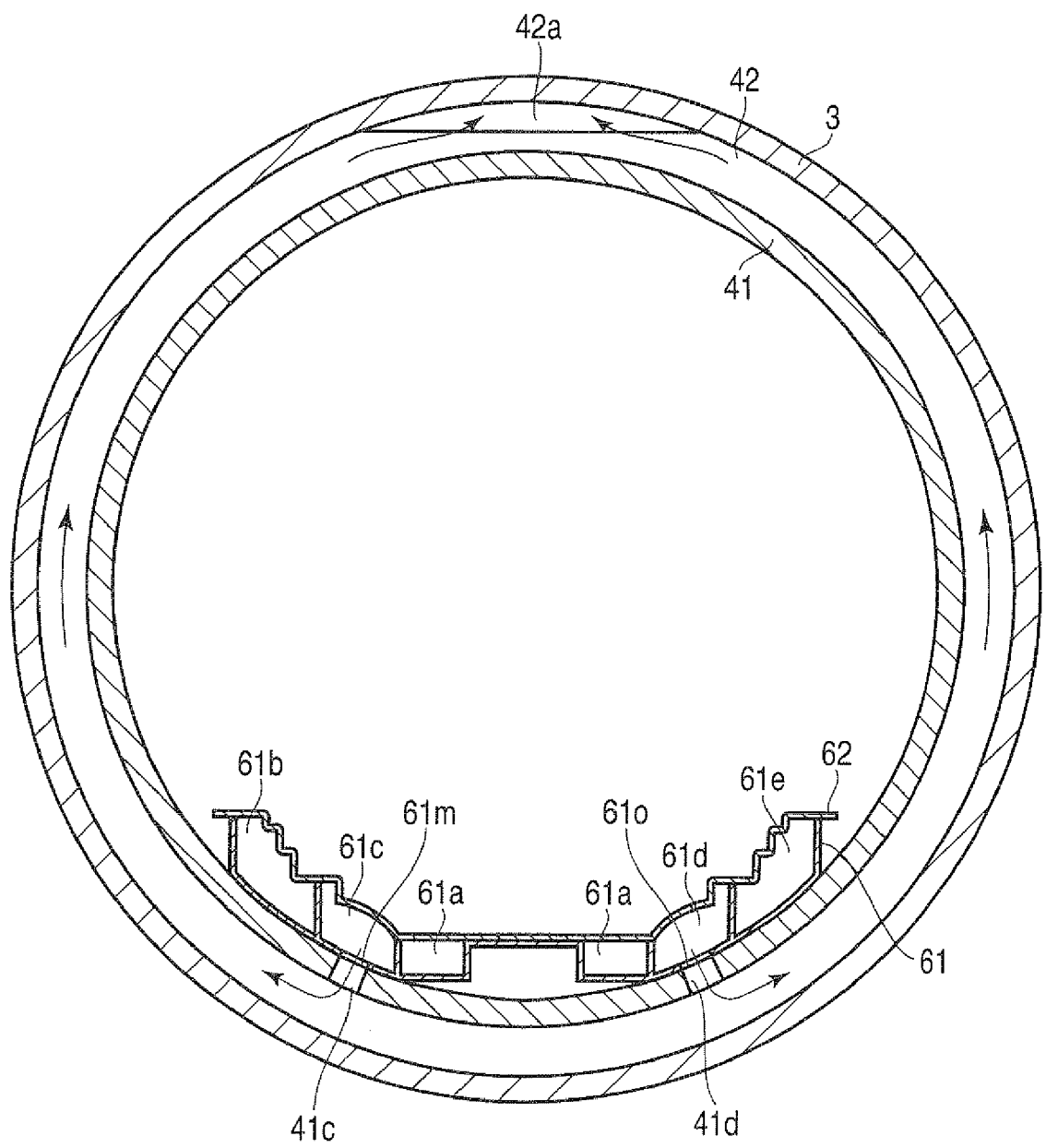
FIG. 7 is a sectional view taken along a one-dot dashed line B of FIG. 1 when viewed from the left side of FIG. 1.

As shown in FIG. 7, the second duct communicates with the space 44a through the openings 61m and 41c. The fifth duct communicates with the space 44a through the openings 61o and 41d.

Figure 8:
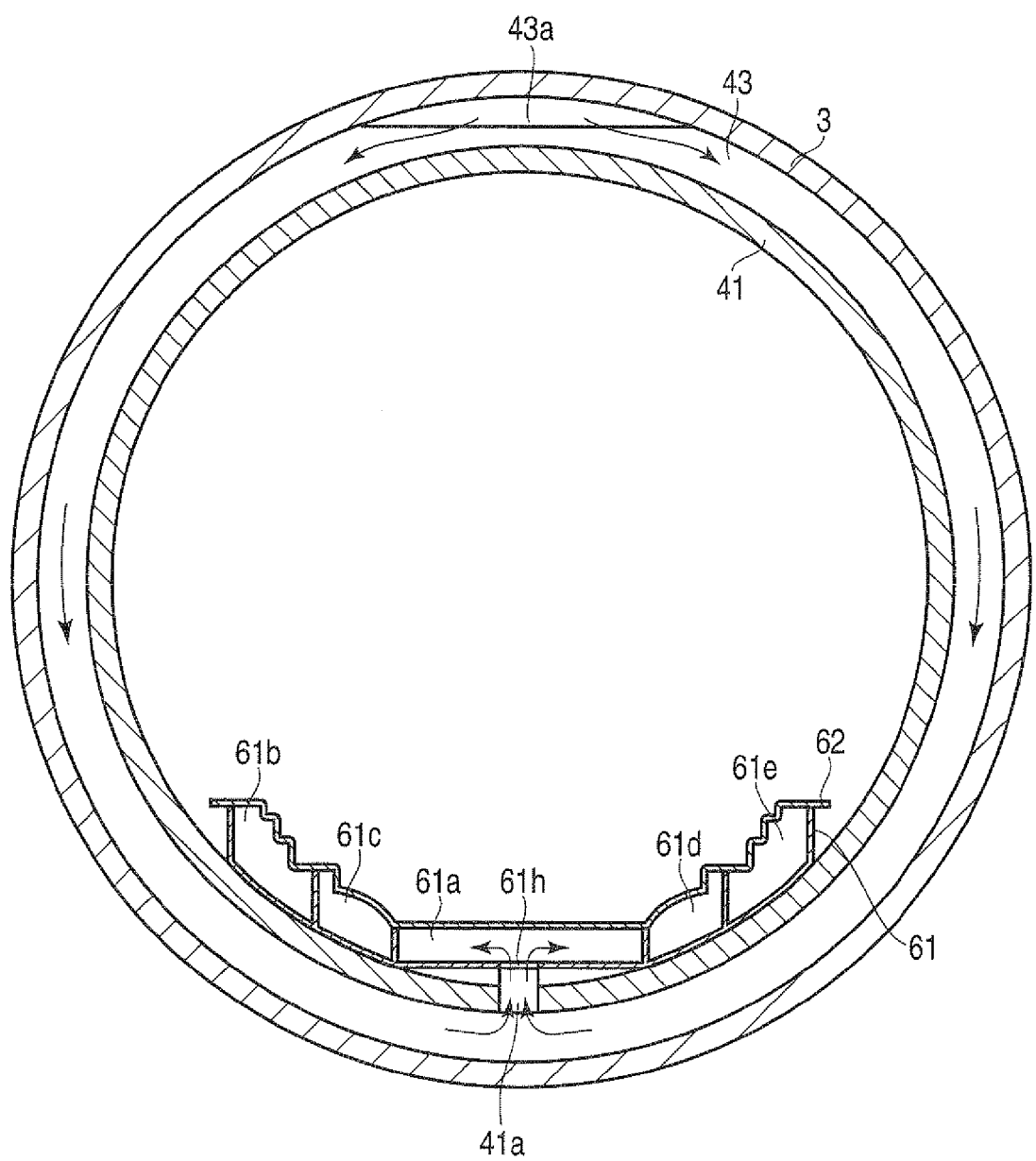
FIG. 8 is a sectional view taken along a one-dot dashed line C of FIG. 1 when viewed from the left side of FIG. 1.

As shown in FIG. 8, both the third and fourth ducts communicate with the space 44b through the openings 61h and 41a.

Figure 9:
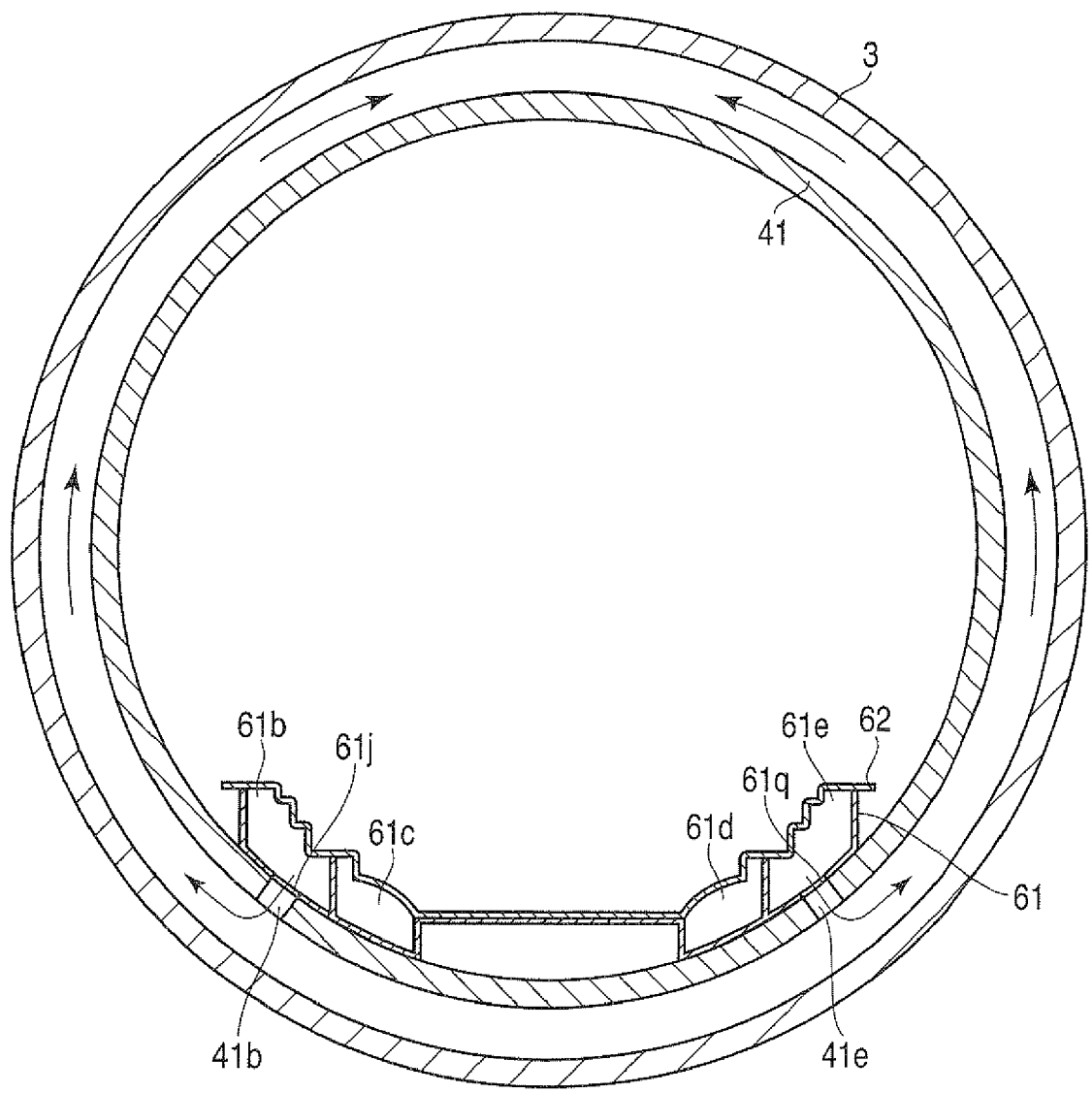
FIG. 9 is a sectional view taken along a one-dot dashed line D of FIG. 1 when viewed from the left side of FIG. 1.

As shown in FIG. 9, the first duct communicates with the space 44c through the openings 613 and 41b. The sixth duct communicates with the space 44c through the openings 61q and 41e.

An air path communicating with the space 44b is formed by the route of opening 61i—first duct—opening 61j—opening 41b—space 44c—opening 43a, the route of opening 61k—second duct—opening 61c opening 41c—space 44a opening 42a, the route of opening 61n—fifth duct—opening 61o—opening 41d—space 44a—opening 42a, or the route of opening 61p—sixth duct—opening 61q—opening 41e—space 44c opening 43a. In addition, an air path communicating with the opening 61 or 61g is formed by the route of space 44b—opening 41a—opening 61h—third or fourth duct.

For this reason, as shown in FIG. 10, when the fan 8 generates a negative pressure in the third and fourth ducts through the extension duct 7, air is drawn through the openings 61i, 61k, 61n, and 61p as indicated by the arrows in FIGS. 6 and 10. The air then flows through the above route, as indicated by the arrows in FIGS. 7 to 9 and 10. At this time, the air flowing in the spaces 44a, 44b, and 44c strikes the circuit elements 46 and 47 provided on the outer surface of the base portion 41 so as to face the spaces 44a, 44b, and 44c. With this operation, the air cools the circuit elements 46 and 47.

The circuit element 46 is located on the upstream side of the above air path relative to the circuit element 47. For this reason, air striking the circuit element 46 is lower in temperature than that striking the circuit element 47, and the circuit element 46 is higher in cooling efficiency than the circuit element 47. In general, a capacitor has a smaller margin for a permissible rise in temperature than a pin diode. This embodiment is based on the assumption that a capacitor is used as the circuit element 46, and a pin diode is used as the circuit element 47. Therefore, a capacitor having a smaller permitted margin for temperature rise can be more efficiently cooled.

As is obvious from FIGS. 7 to 9, air flows in two routes and in different directions in each of the spaces 44a, 44b, and 44c.

For this reason, the temperature difference between air flowing into each space and air flowing out from each space is smaller than that in a case in which air flows in one route and in one direction, and hence each circuit element can be more efficiently cooled.

In addition, since the spaces 61c and 61d are symmetrically formed with respect to the direction in which the bed rail 6 guides the bed top, and so are the spaces 61b and 61e, the flows of air can be stably formed by two routes like those described above.

As described above, according to this embodiment, the heat generated by the circuit elements 46 and 47 can be dissipated to the outside of the gantry more efficiently than through natural convection. This can cool the WB coil unit 4. As a consequence, discomfort given to the subject by heat can be reduced. In addition, according to this embodiment, it is not necessary to increase the gap between the WB coil unit 4 and the cover 5 to take measures against the generation of heat by the WB coil unit 4. This makes it possible to secure a larger distance between the subject and cover 5 and reduce a possibly oppressive feeling given to the subject by cover 5.

In addition, according to this embodiment, since the space formed by the base portion 41 and the bore tube 3 is used as part of an air path, and a duct as part of an air path is formed inside the bed rail 6, there is no need to locate a new space in the gantry in which a duct is to be placed. A duct having a relatively large cross-sectional area can be provided inside the bed rail 6 as compared with a case in which a duct is placed in a new space accommodated in the gantry. This can reduce pressure loss in the duct and more efficiently generate an air current.

In addition, according to this embodiment, since array directions of circuit elements 46 and 47 coincide with directions of air currents, the air currents can be more reliably made to strike circuit elements 46 and 47. Therefore, the circuit elements can be more efficiently cooled.

According to this embodiment, the bed rail 6 has a hollow structure to accommodate ducts, and wall portions for partitioning between and thus defining the ducts function as ribs. More specifically, as shown in FIG. 6, the upper member 62 has horizontal surfaces formed above the wall portions which partition between the openings 61b and 61c and between the openings 61d and 61e. Mounting the rollers of the bed top on these horizontal surfaces allows the above wall portions to support the load of the bed top. This makes the bed rail 6 have high rigidity in spite of being light.

In addition, in this embodiment, the spaces 61a, the spaces 61c and 61d, and the spaces 61b and 61e are symmetric when viewed in the direction in which the bed rail 6 guides the bed top. Therefore, the walls partitioning the respective spaces are symmetric when viewed in the above direction in which the bed rail 6 guides the bed top. This can efficiently increase rigidity of the bed rail 6.

This embodiment can be variously modified as shown by the non-limiting examples that follow.

(1) FIG. 11 is a view showing an example of a modified arrangement. The same reference numbers as in FIG. 1 denote the same parts in FIG. 11.

Referring to FIG. 11, partition members 48, 49, 50, and 51 are provided in place of the particle members 42 and 43, and partition members 52 and 53 are also provided. The partition members 48, 49, 50, and 51 each have a shape similar to that of the partition members 42 and 43, and are arranged on the outside of the base portion 41 so as to be spaced apart from each other like the partition members 42 and 43. The partition member 52 forms one air path by making the opening of the partition member 45 communicate with the opening of the partition member 49. The partition member 53 forms one air path by making the opening of the partition member 50 communicate with the opening of the partition member 51.

In the arrangement shown in FIG. 11, therefore, the space between the partition members 48 and 49 and the space between the partition members 50 and 51 do not serve as air paths, and the cross-sectional areas of the spaces 44a, 44b, and 44c forming an air path are reduced. With this arrangement, the amount of air flowing near the circuit elements 46 and 47 can be increased and the circuit elements can be more efficiently cooled by properly setting the positions of the spaces 44a, 44b, and 44c in accordance with the placement positions of the circuit elements 46 and 47.

Figure 12:
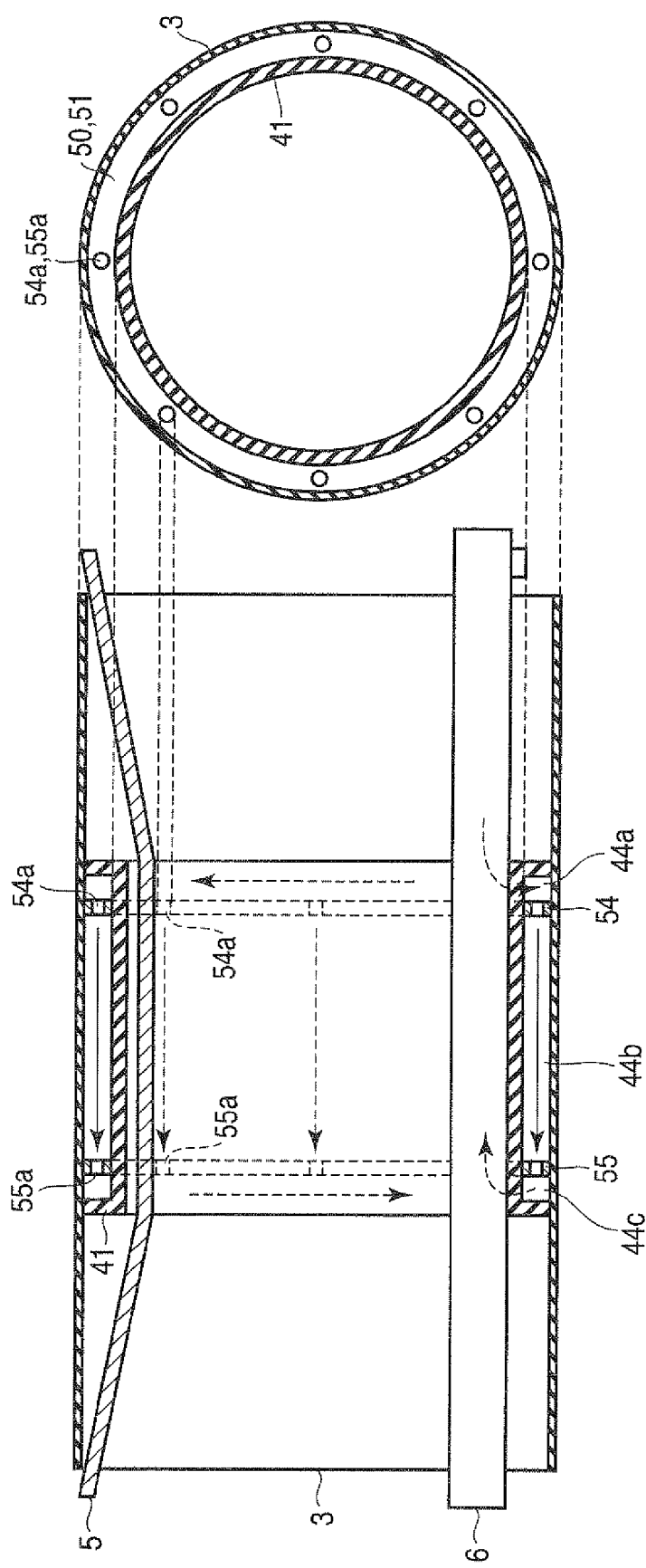
FIG. 12 is a view showing a second modified arrangement.

(2) FIG. 12 is a view showing an example of a modified arrangement. The same reference numbers as in FIG. 1 denote the same parts in FIG. 12.

Referring to FIG. 12, partition members 54 and 55 are provided in place of the partition members 42 and 43. The partition members 54 and 55 are made of, for example, urethane foam, and have almost ring-like shapes. The partition members 54 and 55 have inner diameters almost equal to the outer diameter of the base portion 41 and widths almost equal to the protrusion amount of each flange of the base portion 41. The partition members 54 and 55 are placed outside the base portion 41 so as to be spaced apart from each other. The partition members 54 and 55 therefore partition the space between the base portion 41 and the bore tube 3 into three spaces 44a, 44b, and 44c. Many openings 54a and 55a are formed in the partition members 54 and 55. Note that the numbers of openings 54a and 55a are arbitrary. Although not shown, the positions of the openings 61h, 61j, 61m, 61o, and 61q are changed to make the third and fourth ducts communicate with the space 44c and make the remaining ducts communicate with the space 44a.

The air flowing into the space 44a is blown into the space 44b through the opening 54a and is drawn into the space 44c through the opening 55a. With this operation, when the circuit elements 46 and 47 are arrayed axially relative to the base portion 41, an air current can be formed along the array direction.

Figure 14:
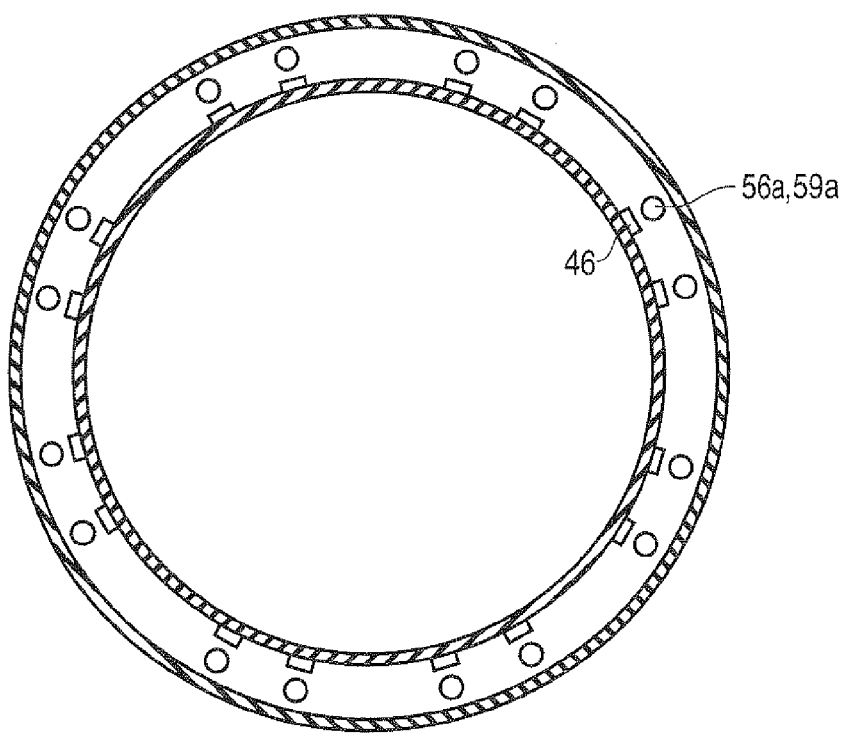
FIG. 14 is a view showing the third modified arrangement.
Figure 15:
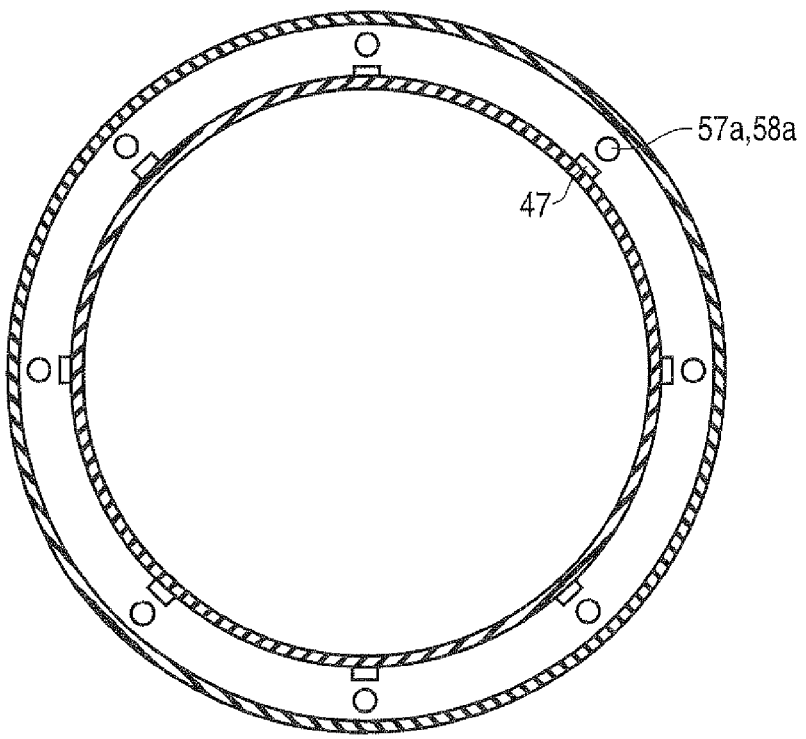
FIG. 15 is a view showing the third modified arrangement.

(3) FIGS. 13 to 15 are views showing an example of a modified arrangement. The same reference numbers as in FIG. 1 denote the same parts in FIGS. 13 to 15.

Referring to FIG. 13, partition members 56, 57, 58, and 59 are provided in place of the partition members 42 and 43. The partition members 56, 57, 58, and 59 are made of, for example, urethane foam, and have almost ring-like shapes. The partition members 56, 57, 58, and 59 have inner diameters almost equal to the outer diameter of the base portion 41 and widths almost equal to the protrusion amount of each flange of the base portion 41. The partition members 56, 57, 58, and 59 are placed outside the base portion 41 so as to be spaced apart from each other. The partition members 56, 57, 58, and 59 therefore partition the space between the base portion 41 and the bore tube 3 into Five spaces 44a, 44b, 44c, 44d, and 44e. The positions of the partition members 56, 57, 58, and 59 are set such that the two arrays of the circuit elements 46 formed as shown in FIG. 2 are respectively located in the spaces 44c and 44d, and the one array of the circuit elements 47 formed as shown in FIG. 2 is located in the space 44b. Many openings 56a, 57a, 58a, and 59a are formed in the partition members 56, 57, 58, and 59.

The openings 56a and 59a are formed to respectively face the circuit elements 46, as shown in FIG. 14. The openings 57a and 58a are formed to respectively face the circuit elements 47, as shown in FIG. 15.

With this arrangement, the air flowing into the space 44a is blown into the space 44c through the openings 56a. At this time, the circuit elements 46 are cooled. The air flowing into the space 44c is blown into the space 44d through the openings 59a. At this time, the circuit elements 46 are cooled. The air flowing into the space 44c is blown into the space 44b through the openings 57a, and the air flowing into the space 44d is blown into the space 44b through the openings 58a. At this time, the circuit elements 47 are cooled.

According to this arrangement, since the air whose flow rate has increased when passing through the openings 56a, 57a, 58a, and 59a is blown against the circuit elements 46 and 47, the circuit elements 46 and 47 can be more efficiently cooled.

(4) The number and shape of ducts in the bed rail 6 can be arbitrarily changed. For example, the groove 61a can be replaced by a linear groove.

(5) It suffices to guide air to the circuit elements 46 and 47 by using ducts placed outside the bed rail 6 or outside the space between the base portion 41 and the bore tube 3.

(6) The fan 8 can be used to send air.

(7) It suffices to circulate a gas other than air by using the fan 8.

(8) The fan 8 need not be a constituent element of the magnetic resonance apparatus, and a general purpose fan can be properly connected and used.

(9) The RA coil to be cooled can be a coil other than a WE coil.

(10) Discrete members can be used as a member (so-called bobbin) which holds the conductive patterns 45 of the WB coil and the circuit elements 46 and 47 and a support member which supports the bobbin on the bore tube 3. In this structure, a member different from the support member can be placed to form a space serving as an air path in the gap between the bobbin and the bore tube 3.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging (MRI) apparatus comprising:

a static field magnet which generates a static magnetic field;

a gradient field coil, located inwardly of the static field magnet, which generates a gradient magnetic field superimposed on the static magnetic field;

a cylindrical bore tube disposed inside the gradient field coil;

a radio frequency coil unit, located inwardly of the bore tube leaving an annular space therebetween, which coil unit includes a cylindrical base portion having disposed thereon a first group of electronic circuit elements and a second group of electronic circuit elements within said annular space, said first and second groups of electronic circuit elements being arranged circumferentially around an outer side of the cylindrical base portion in said annular space;

a first annular gas flow path which is formed in said annular space between the outer side of the cylindrical base portion and an inner side of the cylindrical bore tube in order to gas-cool the first group of electronic circuit elements;

a second annular gas flow path formed in said annular space between the outer side of the cylindrical base portion and the inner side of the cylindrical bore tube, said second annular gas flow path communicating with the first annular gas flow path through at least one connecting gas flow port at which the gas flow changes direction from the first annular gas flow path into the second annular gas flow path in order to gas-cool the second group of electronic circuit elements; and a cooling unit, located external to said cylindrical base portion and external to said annular space, which gas-cools the radio frequency coil unit by generating a cooling gas flow flowing into said first annular gas flow path and from the first annular gas flow path to the second annular gas flow path.

2. The MRI apparatus according to claim 1, wherein the first group of electronic circuit elements has a margin for permitted temperature rise that is smaller than that of the second group of electronic circuit elements.

3. The MRI apparatus according to claim 1, wherein the first group of electronic circuit elements are capacitors and the second group of electronic circuit elements are pin diodes.

4. The MRI apparatus according to claim 1, wherein
the first flow path is formed between the base portion and the bore tube circumferentially along the base portion, and
the cooling unit generates two cooling gas flows, each in respectively different directions circumferentially along the base portion.

5. The MRI apparatus according to claim 1, wherein
the second flow path is formed between the base portion and the bore tube circumferentially along the base portion, and
the cooling unit generates two cooling gas flows, each in a respectively different direction circumferentially along the base portion.

6. A magnetic resonance imaging (MRI) apparatus comprising:
a static field magnet which generates a static magnetic field;
a gradient field coil, located inwardly of the static field magnet, which generates a gradient magnetic field superimposed on the static magnetic field;
a cylindrical bore tube disposed inside the gradient field coil; a radio frequency coil unit, located inwardly of the cylindrical bore tube leaving an annular space therebetween, which coil unit includes a cylindrical base portion having disposed thereon a plurality of electronic circuit elements arranged on the cylindrical base portion in said annular space;
at least two annular gas flow paths formed in said annular space between an outer side of the cylindrical base portion and an inner side of the cylindrical bore tube circumferentially along the base portion in order to cool the electronic circuit elements, said two annular gas flow paths being interconnected by at least one gas flow port at which the gas flow changes direction as it passes from one annular gas flow path to the other; and
a cooling unit, located external to said cylindrical base portion and external to said annular space, which gas-cools the radio frequency coil unit by generating two cooling gas flows, each in a different respective direction circumferentially along the cylindrical base portion in respectively corresponding ones of said annular gas flow paths.

7. A magnetic resonance imaging (MRI) apparatus further comprising:

a static field magnet which generates a static magnetic field;
a gradient field coil, located inwardly of the static field magnet, which generates a gradient magnetic field superimposed on the static magnetic field;
a cylindrical bore tube disposed inside the gradient field coil;
a radio frequency coil unit, located inwardly of the bore tube, which includes a cylindrical base portion having disposed thereon a first group of electronic elements and a second group of electronic elements, said first and second groups of electronic elements being arranged circumferentially around an outer side of the cylindrical base portion;
a first flow path which is formed between the outer side of the cylindrical base portion and an inner side of the cylindrical bore tube in order to cool the first group of electronic elements;
second flow path formed between the outer side of the cylindrical base portion and the inner side of the cylindrical bore tube, said second flow path communicating with the first flow path in order to cool the second, group of electronic elements;
a cooling unit, located external to said cylindrical base portion, which cools the radio frequency coil unit by generating a cooling gas flow flowing into said first flow path and from the first flow path to the second flow path; and
a bed guide member which guides a bed on which a subject is placed to be imaged,
the first flow path and the second flow path extending into the bed guide member.

8. A magnetic resonance imaging (MRI) apparatus comprising:
a static field magnet which generates a static magnetic field;
a gradient field coil, located inwardly of the static field magnet, which generates a gradient magnetic field superimposed on the static magnetic field;
a cylindrical bore tube disposed inside the gradient field coil;
a radio frequency coil unit, located inwardly of the cylindrical bore tube, which includes a cylindrical base portion having disposed thereon a plurality of electronic elements arranged on the cylindrical base portion;
a flow path formed between an outer side of the cylindrical base portion and an inner side of the cylindrical bore tube circumferentially along the base portion in order to cool the electronic elements;
a cooling unit, located external to said cylindrical base portion, which cools the radio frequency coil unit by generating two cooling-gas flows, each in a different respective direction circumferentially along the cylindrical base portion; and
a bed guide member which guides a bed top on which a subject is to be placed to be imaged,
wherein a plurality of gas flow introduction paths are formed in the bed guide member in order to introduce cooling gas into the flow path, and
a plurality of discharge paths are formed inside the bed guide member in order to discharge cooling gas from the flow path.

9. The MRI apparatus according to claim 8, wherein the plurality of introduction paths are symmetric when viewed in a direction in which the bed guide member guides the bed top.

10. The MRI apparatus according to claim 8, wherein the plurality of discharge paths are symmetric when viewed in a direction in which the bed guide member guides the bed top.

11. The MRI apparatus according to claim 8, wherein a combination of the introduction paths and the discharge paths is symmetric when viewed in a direction in which the bed guide member guides the bed top.

12. A magnetic resonance imaging (MRI) apparatus comprising:
- a static field magnet which generates a static magnetic field;
- a gradient field coil, located inwardly of the static field magnet, which generates a gradient magnetic field superimposed on the static magnetic field;
- a cylindrical bore tube disposed inside said magnetic gradient field coil;
- a radio frequency coil unit, located inwardly of the cylindrical bore tube, which includes a cylindrical base portion having disposed thereon a plurality of electronic circuit elements arranged circumferentially around an outer side of the cylindrical base portion in a circumferential direction thereof;
- a cooling-gas flow path which is formed between the outer side of the cylindrical base portion and an inner side of the cylindrical bore tube in order to guide a cooling gas in the circumferential direction of the cylindrical base portion;
- at least one discharge port which discharges cooling gas from the flow path toward the electronic circuit elements; and
- a cooling unit, located externally to said cylindrical base portion, in order to cool the radio frequency coil unit by generating a flow of cooling gas discharged from the discharge port toward the electronic circuit elements through the cooling gas flow path:
- wherein the discharge ports are provided in the same number as that of the plurality of electronic circuit elements so as to separately discharge cooling gas toward respective ones of the plurality of electronic circuit elements.

13. A magnetic resonance imaging (MRI) apparatus comprising:
- a static field magnet which generates a static magnetic field;
- a gradient field coil, located inwardly of the static field magnet, which generates a gradient magnetic field superimposed on the static magnetic field;
- a cylindrical bore tube disposed inside said magnetic gradient field coil;
- a radio frequency coil unit, located inwardly of the cylindrical bore tube leaving an annular space therebetween, which coil unit includes a cylindrical base portion having disposed thereon a plurality of electronic circuit elements arranged circumferentially around an outer side of the cylindrical base portion in a circumferential direction thereof;
- at least one annular cooling gas flow path which is formed between the outer side of the cylindrical base portion and an inner side of the cylindrical bore tube in order to guide a cooling gas circumferentially around the cylindrical base portion;
- a plurality of gas discharge ports which discharges cooling gas in a changed direction from the at least one annular flow path toward respectively aligned electronic circuit elements; and
- a cooling unit, located externally to said cylindrical base portion and external to said annular space, in order to gas-cool the radio frequency coil unit by generating a flow of cooling gas discharged from the discharge ports toward respectively aligned electronic circuit elements in the cooling gas flow path.

14. The MRI apparatus according to claim 12, in which
the plurality of electronic circuit elements include a first group of electronic circuit elements and a second group of electronic circuit elements which are arranged circumferentially at different positions in the circumferential direction of the cylindrical base portion,
the cooling gas flow path includes a first flow path and a second flow path in order to separately guide a cooling gas in the circumferential direction of the cylindrical base portion, and
said discharge port discharges cooling gas from the first flow path toward the first group of electronic circuit elements,
wherein the apparatus further comprises:
- at least one suction port which draws cooling gas discharged toward the first group of electronic circuit elements into the second flow path while blowing cooling gas against the second group of electronic circuit elements.

15. The MRI apparatus according to claim 14, wherein the suction ports are provided in the same number as that of the plurality of electronic circuit elements in said second group so as to each individually blow cooling gas against a corresponding one of the plurality of electronic circuit elements in said second group.

* * * * *